(12) United States Patent
Cabral, Jr. et al.

(10) Patent No.: US 6,380,075 B1
(45) Date of Patent: Apr. 30, 2002

(54) METHOD FOR FORMING AN OPEN-BOTTOM LINER FOR A CONDUCTOR IN AN ELECTRONIC STRUCTURE AND DEVICE FORMED

(75) Inventors: Cyril Cabral, Jr., Ossining; Chao-Kun Hu, Sommers; Sandra Guy Malhotra, Beacon; Fenton Read McFeely, Ossining; Stephen Mark Rossnagel, Pleasantville; Andrew Herbert Simon, Fishkill, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/676,546

(22) Filed: Sep. 29, 2000

(51) Int. Cl.⁷ .......................................... H01L 21/4763
(52) U.S. Cl. ..................... 438/637; 438/627; 438/643; 438/653
(58) Field of Search ................... 438/637–640, 438/624, 627–629, 643–644, 648, 653–654, 656, 667–668, 672–673, 675, 685, 687–688

(56) References Cited

U.S. PATENT DOCUMENTS

| | | | | |
|---|---|---|---|---|
| 5,930,669 A | * | 7/1999 | Uzoh | 438/627 |
| 6,040,243 A | * | 3/2000 | Li et al. | 438/687 |
| 6,077,774 A | * | 6/2000 | Hong et al. | 438/643 |
| 6,169,024 B1 | * | 1/2001 | Hussein | 438/627 |
| 6,218,301 B1 | * | 4/2001 | Yoon et al. | 438/685 |

* cited by examiner

*Primary Examiner*—Charles Bowers
*Assistant Examiner*—Thanh Nguyen
(74) *Attorney, Agent, or Firm*—Robert M. Trepp; Randy W. Tung

(57) ABSTRACT

A method for forming an open-bottom liner for a conductor in an electronic structure and devices formed are disclosed. In the method, a pre-processed electronic substrate that has a dielectric layer on top is first provided. Via openings are then formed in a dielectric layer to expose an underlying conductive layer. The electronic substrate is then positioned in a cold-wall, low pressure chemical vapor deposition chamber, while the substrate is heated to a temperature of at least 350° C. A precursor gas is then flowed into the CVD chamber to a partial pressure of not higher than 10 mTorr, and metal is deposited from the precursor gas onto sidewalls of the via openings while bottoms of the via openings are substantially uncovered by the metal. The present invention method may be further enhanced by, optionally, modifications of a I-PVD technique or a seed layer deposition technique.

10 Claims, 3 Drawing Sheets

METHOD FOR FORMING AN OPEN-BOTTOM LINER FOR A CONDUCTOR IN AN ELECTRONIC STRUCTURE AND DEVICE FORMED

FIELD OF THE INVENTION

The present invention generally relates to a method for forming a liner for a conductor in an electronic structure and device formed and more particularly, relates to a method for forming an open-bottom liner for a via plug in a semiconductor structure and device formed by the method.

BACKGROUND OF THE INVENTION

In modern semiconductor devices, the interconnect wiring structures consist of multiple levels of metal lines (wires) and dielectric layers (insulator). The lines may take the form of etched films on the dielectric surface, or embedded metal wires fabricated in trenches in the dielectric. This latter fabrication technique is known as Damascene processing. A via is a vertical connection, usually circular or square in cross-section, which electrically connects wires on different dielectric levels. If a via is formed in conjunction with a Damascene (embedded) line, the fabrication process is known as "dual Damascene". A schematic view of a dual damascene structure 10 incorporating such wiring structures is shown in FIG. 1. The structure 10 consists of two layers of inter-level dielectric materials 12,14, into which features containing a conductive metal 16,18 such as Cu or Al are provided. An adhesion diffusion barrier liner 20 is used to line the openings to separate the conductive metal 16,18 from the dielectric matrix 12,14. A capping layer 22 is further used to complete the encapsulation of the conductors 16,18. A suitable capping layer 22 is normally formed of silicon nitride. The layers are formed as shown in FIG. 1 to provide electrical connection to the underlying circuit element 24. The adhesion diffusion barrier layer 20, or the liner layer, is an important element for the successful operation of the semiconductor structure 10. It is frequently formed of a material, or materials that are impermeable to the materials that form the conductors 16,18. Its function is to provide adhesion and prevent the diffusion of the conductor materials 16,18 into the dielectric matrix material 12,14 which would lead to electrical and structural problems.

In the conventional structure 10 shown in FIG. 1, the very property that leads to its utilization as a liner, i.e. its impermeability towards the conductor material, leads to a phenomenon of electromigration-induced voiding. The phenomenon is shown in FIG. 2. Electrons flow continuously from the circuit element 24 through the conductor material 16 and the boundary layer 26 to the upper conductor 18. The boundary layer 26 is part of the liner 20 formed at the bottom of the upper conductor 18. When a voltage is applied, the electron current will be constant across the boundary layer 26 as dictated by the Kirchoff's Law. An electromigration process thus occurs through the boundary layer 26 in which atoms of the conductor material 18 are swept along with the electrical currents. The atoms of the lower conductor material 16 are accumulated below the boundary layer 26. On the upper side of the boundary layer 26, there is the same electrical current such that atoms of the upper conductor 18 move in the same direction as atoms in the lower conductor 16 in an upward direction. At the boundary layer 26, however, neither the movement of atoms of the liner layer 22, nor the atoms 16 through the liner layer 22, can occur. The material chosen for the liner layer 22 is very low diffusivity and prevents the permeation of the atoms of the conductor material 16. Thus, at the top of the boundary layer 26, electromigration driving force pushes the diffusing atoms of the conductor 18 away from the boundary layer 26, while atoms from the conductor 16 from below the boundary layer 26 cannot flow through the boundary layer 26 to take their place. This is known in semiconductor technology as flux divergence. The result is the formation of an electromigration-induced void 30, shown in FIG. 2. The formation of the void 30 dramatically increases the resistance of the conductor 18 and thus leads to the formation of an open circuit. Even though materials chosen for the conductors are frequently optimized for resistance to electromigration, the electromigration phenomenon can never be entirely eliminated and thus, the failure mechanism caused by electromigration-induced voids is always a reliability issue.

A widely used method for liner formation in the semiconductor industry is sputter deposition, a physical vapor deposition (PVD) technique. Sputter deposition occurs by the flow of metal atoms at low vapor pressure toward a target. It is also known as a line-of-sight deposition process. Sputtered atoms tend to have a near-unity sticking coefficient, i.e. they tend to stick and deposit on the first surface they encounter. Sputter deposition can be carried out in the semiconductor industry by a variety of techniques, i.e. conventional, collimated and ionized. In the conventional sputter process, a widely divergent flux of atoms flows to a surface and thus tend to deposit atoms on planar surfaces and at the very top corners of high aspect ratio features. The collimated sputtering technique utilizes a geometrical filter, thus resulting in a mostly normal incidence flux of atoms to a surface. This leads to a deposition in which the planar surface receives a thick deposit, the sidewalls of a feature receive a thin deposit, while the bottom surface of the feature receives an intermediate amount of deposit.

The third sputtering technique, i.e. the ionized sputter deposition relies on the in-flight ionization of the metal atoms, such that a majority of the atoms are deposited on the surface as ions. The ionized sputter deposition therefore results in an intrinsically normal incidence deposition, and the ability to control the kinetic energy of the depositing species by adjusting the sample bias voltage. This latter feature is important for self-sputtering of the deposited film. When the sample bias voltage is sufficiently negative (relative to the plasma potential), the depositing metal ions can cause physical sputtering of the already-deposited metal particles. In the case of a trench or via, this can lead to a reduction in the deposition on the bottom surface where the ions impact, resulting in redeposition of those atoms on the sidewalls. This redeposition process can be a very desirable process for altering the sidewall thickness. However, too much resputtering can result in the complete removal of the deposited films in both the bottom of a via as well as the bottom of a trench. The latter feature is undesirable and should be avoided.

Another processing technique that is used for depositing a liner structure is chemical vapor deposition (CVD). The CVD technique is not a line-of-sight process since it relies on a sequence of steps, i.e. the gas phase condensation of the precursors, the reaction steps, and the emission of a volatile product molecules. The CVD deposition technique can be optimized to result in mostly conformal films, similar to those shown in FIG. 1. The CVD technique provides improved step coverage of the deposited film at any point in the feature as compared to the thickness on the top or planar areas. However, the CVD method as currently practiced in the semiconductor industry, would not result in the deposition of a liner structure that is open-bottomed.

It is therefore an object of the present invention to provide a method for forming a liner structure for a conductor in a semiconductor structure that does not have the drawbacks or shortcomings of the conventional methods.

It is another object of the present invention to provide a method for forming an open-bottom liner for a conductor in a semiconductor structure for improved electrical conductance with an underlying conductive layer.

It is a further object of the present invention to provide a method for forming an open-bottom liner for a conductor in a semiconductor structure by a modified chemical vapor deposition technique.

It is another further object of the present invention to provide a method for forming an open-bottom liner for a via plug in a semiconductor structure in a cold-wall low pressure chemical vapor deposition chamber.

It is still another object of the present invention to provide a method for forming an open-bottom liner for a via plug in a semiconductor structure by heating a semiconductor substrate to a temperature of at least 350° C., and flowing a precursor gas into the chamber at a partial pressure of not higher than 10 mTorr.

It is yet another object of the present invention to provide a method for forming an open-bottom liner for a via plug in a semiconductor structure wherein an open-bottom tungsten liner is formed for a copper via plug.

It is still another further object of the present invention to provide an electronic structure that has a metal conductor formed therein wherein a metal liner layer covers sidewalls of the metal conductor while leaving a bottom of the conductor uncovered.

It is yet another further object of the present invention to provide an electronic structure that has a metal conductor formed therein wherein a tungsten layer covers sidewalls of the copper via while the bottom of the copper via plug is substantially uncovered.

SUMMARY OF THE INVENTION

In accordance with the present invention, a method for forming an open-bottom liner for a conductor in an electronic structure and a device formed by the method are disclosed.

In a preferred embodiment, a method for forming an open-bottom liner for a conductor in an electronic structure can be carried out by the operating steps of first providing a pre-processed electronic substrate that has a dielectric layer on top, forming via openings in the dielectric layer by exposing an underlying conductive layer, positioning the electronic substrate in a chemical vapor deposition chamber, heating the electronic substrate to a temperature of at least 350° C., flowing a precursor gas, either neat or by means of a carrier gas, into the CVD chamber to a deposition partial pressure not higher than 10 mTorr, and depositing metal from the precursor gas onto sidewalls of the via openings while leaving bottoms of the via openings substantially uncovered.

The method for forming an open-bottom liner for a conductor in an electronic substrate may further include the step of providing a pre-processed silicon wafer that has a dielectric material, such as polyimide, silicon nitride, or silicon oxide layer on top. The method may further include the step of heating the electronic substrate to 400° C. prior to the deposition step, or the step of flowing $W(CO)_6$ into the CVD chamber either neat or by means of a carrier gas for depositing W into the via openings and forming a liner on the sidewalls. The method may further include the step of re-sputtering W to a thickness of less than 5 nm on the sidewalls by simultaneously removing residual W deposited at a bottom of the via openings by the re-sputtered W ions. The method may further include the step of depositing a Cu seed layer on top of the W liner in the via openings, or the step of depositing a Cu seed layer on top of the W layer by an ionized physical vapor deposition technique at a kinetic energy of the Cu atoms of at least 50 eV, or the step of depositing a Cu seed layer on top of the W layer to a sufficient thickness such that a bond strength achieved between a subsequently deposited Cu film and the W liner is at least 0.4 $MPam^{1/2}$.

The present invention is further directed to the method for forming via plugs in a semiconductor substrate that can be carried out by the steps of providing a semiconductor substrate that has a dielectric layer deposited on top, forming via openings in the dielectric layer exposing an underlying conductive layer, positioning the semiconductor substrate in a CVD chamber, heating the semiconductor substrate to a temperature of at least 350° C., flowing a precursor gas into the CVD chamber to a deposition partial pressure not higher than 10 mTorr, depositing a metal liner layer from the precursor gas onto sidewalls in the via openings without depositing a substantial amount on the bottoms of the via openings, depositing a metal seed layer into the via openings covering sidewalls and bottoms of the via openings, and depositing a metal film of the same material as the metal seed layer filling the via openings and establishing electrical contact with the underlying conductive layer.

The method for forming via plugs in a semiconductor substrate may further include the step of depositing a metal liner layer in W and depositing a metal seed layer in Cu. The present invention is still directed to an electronic structure that has a metal conductor covered on its sidewalls by a liner layer formed therein which includes an electronic substrate that has a dielectric layer formed on top of a conductive layer, a via opening formed in the dielectric layer exposing the conductive layer, a metal liner covers sidewalls of the via opening while substantially leaving a bottom of the via opening uncovered, and a conductive metal filling the via opening in electrical contact with the conductive layer forming the metal conductor.

In the electronic structure that has a metal conductor therein covered on its sidewalls by a liner layer, the metal liner includes W and the conductive layer includes Cu. The electronic structure further includes a metal seed layer deposited inbetween the metal liner layer and the metal conductor. The metal seed layer may be formed of Cu.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
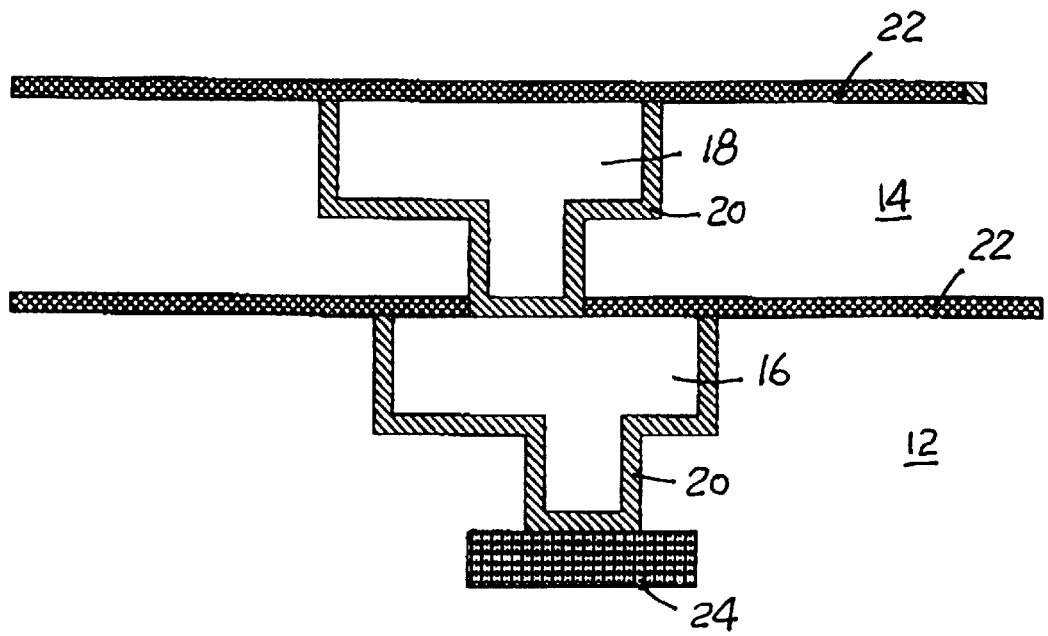
FIG. 1 is an enlarged, cross-sectional view of a conventional dual-damascene interconnect structure in a semiconductor device wherein the interconnect is provided with a diffusion barrier liner.
Figure 2:
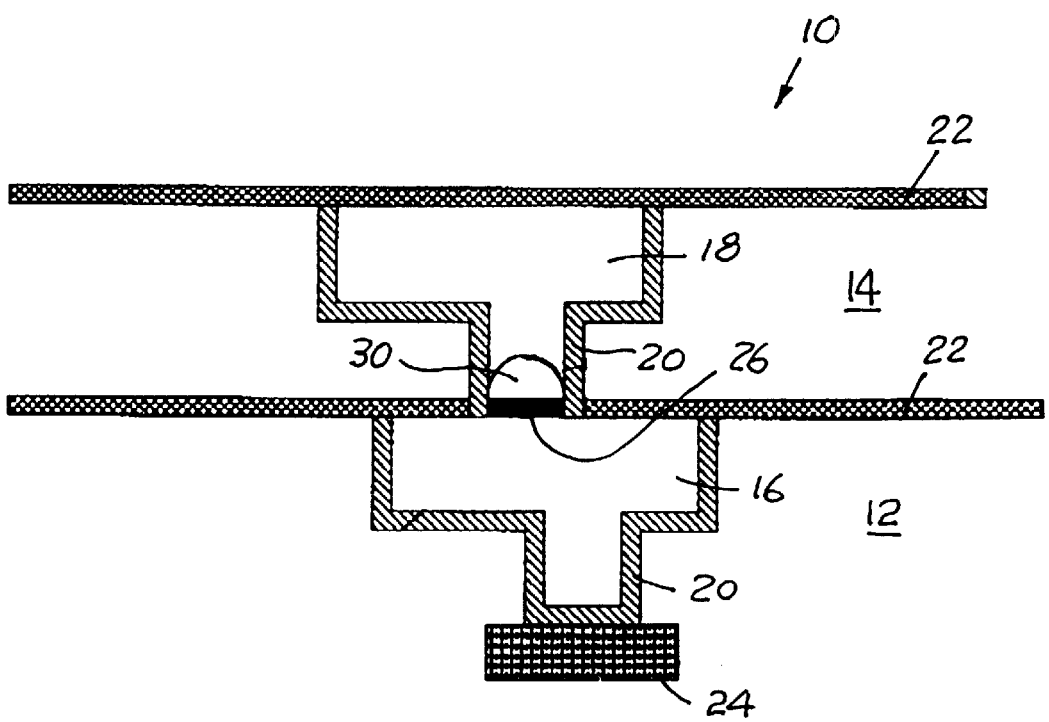
FIG. 2 is an enlarged, cross-sectional view of the conventional semiconductor structure of FIG. 1 illustrating the formation of an electromigration-induced void.

The present invention discloses a method for forming an open-bottom liner for a conductor in an electronic structure and a device formed by the method.

In the method, a pre-processed electronic substrate that has a dielectric layer on top is first provided. Via openings are then formed in the dielectric layer to expose an underlying conductive layer. The electronic substrate is then positioned in a cold-walled low pressure chemical vapor deposition chamber, while the substrate is heated to a temperature of at least 350° C., and preferably 400° C. A precursor gas, either neat or by means of a carrier gas, is then flown into the CVD chamber to a deposition partial pressure not higher than 10 mTorr. A metal film is thus deposited from the precursor gas onto the sidewalls of the via openings while the bottoms of the via openings are substantially uncovered.

The present invention is further directed to a method for forming via plugs in a semiconductor substrate which can be carried out by first providing a semiconductor substrate that has a dielectric layer deposited on top of an underlying conductive layer. Via openings are then formed in the dielectric layer to expose the underlying conductive layer. The semiconductor substrate is then positioned in a CVD chamber, while the substrate is heated to a temperature of at least 350° C. A precursor gas containing W is then flowed into the CVD chamber to a deposition partial pressure not higher than 10 mTorr to deposit a metal liner layer on to the sidewalls of the via openings without depositing a substantial W layer on the bottoms of the via openings. A metal seed layer is then deposited into the via openings to cover the sidewalls and the bottoms, followed by the deposition of a metal film of the same material as the seed layer to fill the via openings and to establish electrical connection with the underlying conductive layer.

The present invention still further discloses an electronic structure that has a metal conductor formed therein which includes and electronic substrate that has a dielectric layer formed on top of a conductive layer, a via opening formed in the dielectric layer to expose the conductive layer, a metal liner covers the sidewalls of the via openings while substantially leaving the bottom of the via opening uncovered, and a conductive metal filling the via opening in electrical contact with a conductive layer forming the metal conductor.

The present invention is further directed to dual, or multiple layer wiring structures used for the interconnection of microelectronic devices, in particular, relates to the design and fabrication of such structures so as to improve their robustness with regard to electromigration-induced degradation.

It has been found that one way to reduce or prevent flux divergence which leads to electromigration-induced voiding at the interface between a via plug, or an interconnect or a contact, and an underlying metal feature is to significantly reduce or eliminate the liner formation at the bottom of the via, but only at such location without affecting the bottom liner formation in trenches or metal lines.

In utilizing the present invention novel method, it is important to differentiate between the bottom surface of a trench or line, and the bottom surface of a via hole. It is suggested that the bottom of a trench or line should be provided with adequate liner coverage, otherwise it may lead to interdiffusion-based problems between the metal of the conductive line and either the dielectric or some nearby feature such as another conductor, or the silicon surface, etc.

Based on this requirement, it is therefore not possible to use physical sputtering alone to remove the liner at the bottom of a via without simultaneously removing the liner at the bottom of a trench or line. This precludes the use of either inert-gas sputtering or self-sputtering that may occur during deposition using ionized physical vapor deposition (I-PVD) alone as a bottom-clearing process.

Figure 3:
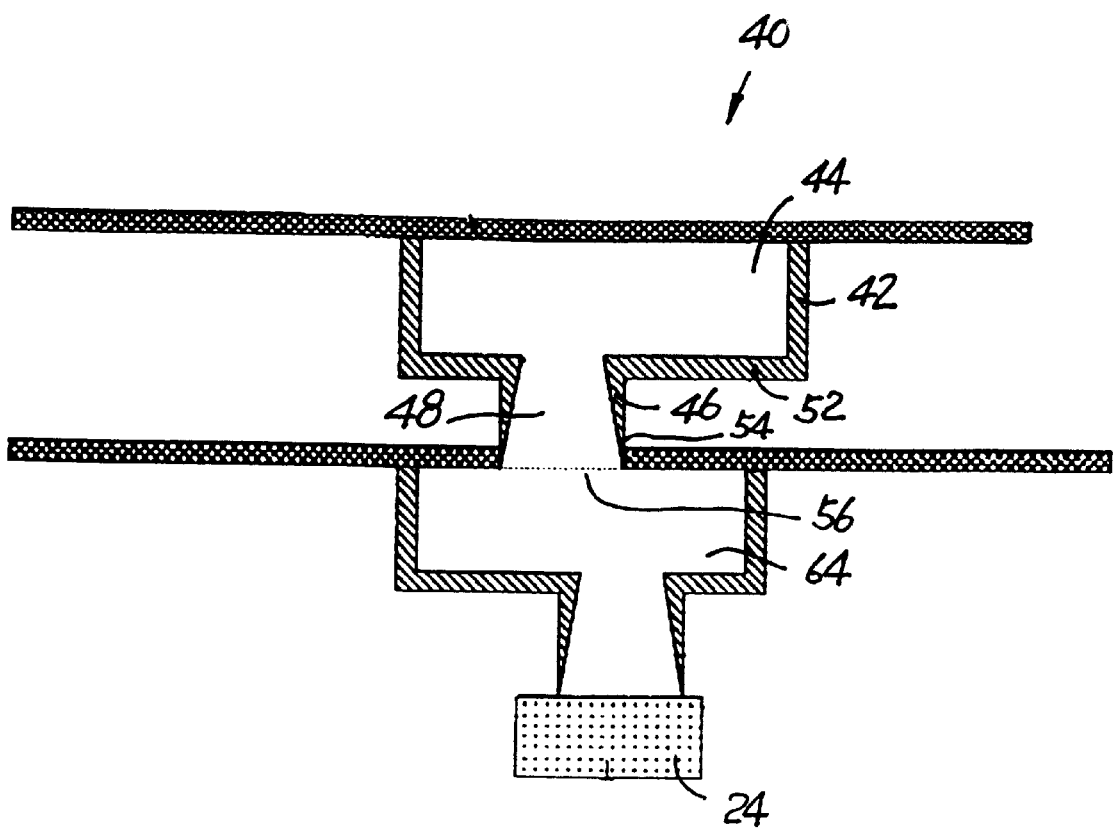
FIG. 3 is an enlarged, cross-sectional view of a present invention dual-damascene interconnect structure wherein a liner layer only covers the sidewalls of the metal conductor and not the bottom.
Figure 4:
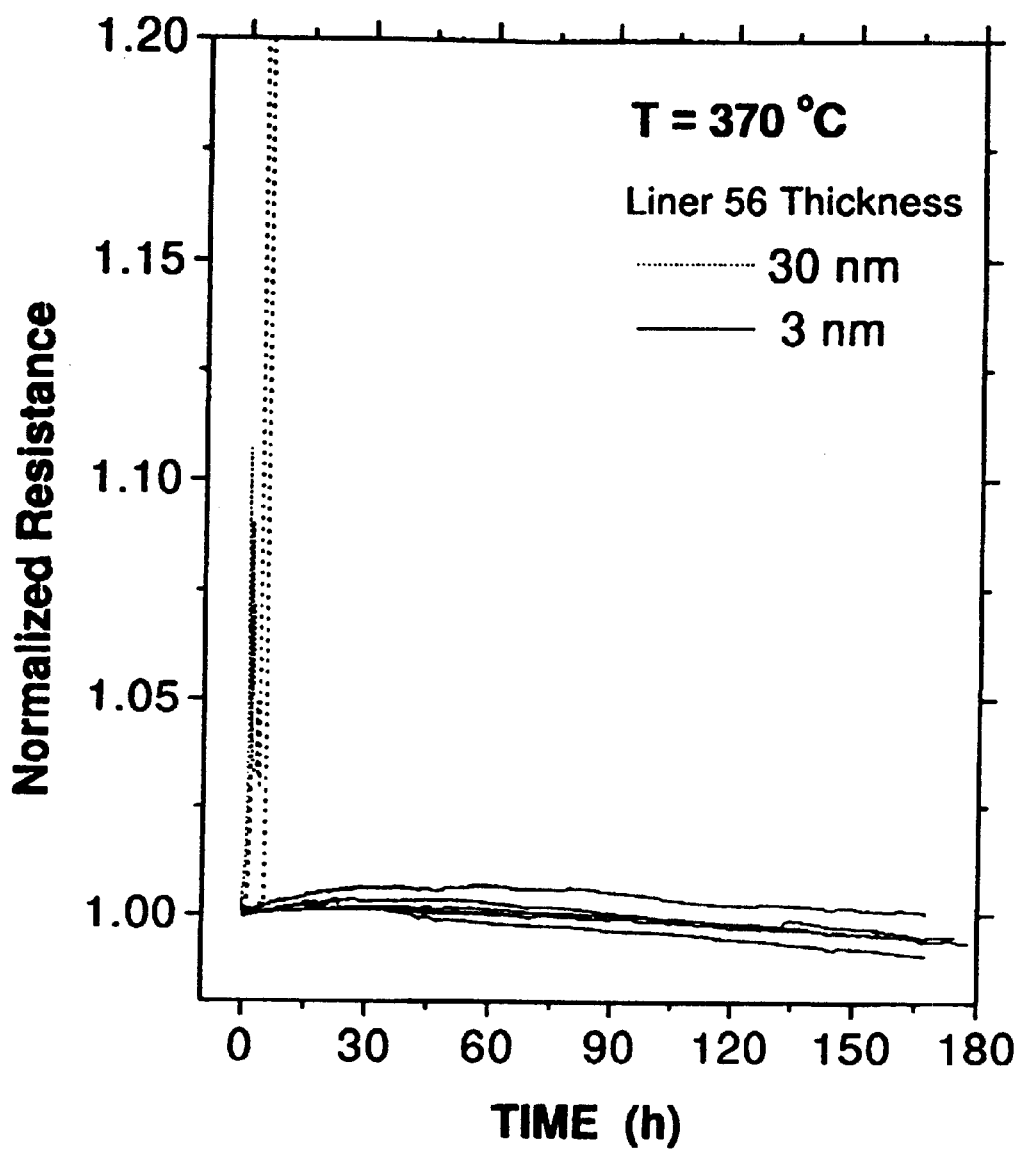
FIG. 4 is a graph illustrating a normalized line resistance plot vs time for lines stressed at a current density of $2.5 \times 10^6$ $amp/cm^2$ at 370° C. wherein the bottom liner thickness is 30 nm or 3 nm.

Referring now to FIG. 3, wherein an enlarged, cross-sectional view of a present invention semiconductor structure 40 is shown. In the semiconductor structure 40, it is seen that a complete and functional liner 42 on the sidewalls of the trench 44, on the sidewall 46 of the via 48, and most importantly, on the bottom 52 of the trench 44 are shown. The liner 46 on the sidewall of the via tapers down such that near bottom 54 of the sidewalls 46 of the via 48, the liner thickness is very thin as is the deposition on the bottom 56 of the via. The structure 40 is accomplished by altering the reaction rate of a CVD process. It is found that only the film thickness at the bottom, or interface 56 of the via needs to be thin, less than 10 nm. This allows the movement of the conductor metal atoms, such as Cu, to flow through bottom 56 between the via 48 and the underlying metal structure, i.e. a metal trench 64. As a result of electromigration, on side of the conductor/liner interface will be in a tensile stress, and the other side will be in a compressive stress. The electromigration induced compressive stress can generate a force large enough to crack the liner and allow the atoms to punch through the liner. Thus, it will diminish the atom flux divergence at the interfaces and increase the lifetime of the metal interconnections. FIG. 4 shows a three-level Cu damascene line resistance as a function of time and the thickness of bottom liner 56 with the current density of $2.5 \times 10^6$ amp/cm$^2$ at 370° C. A drastic line resistance increases occurred at about 2 hours for the samples with the bottom liner thickness of 30 nm. On the other hand, no significant line resistance change occurred even after 100 hours for samples with a bottom liner thickness 56 of 3 nm. The porous, or open bottom 56 between the conductive metal of via 48, i.e. for instance Cu, and the conductive metal of the underlying metal structure, i.e. trench 64 which is the same as the via material will significantly further reduce or eliminate the flux divergence problem and hence reduce the voiding phenomenon. In fact, FIG. 4 clearly shows that the coating on bottom 56 is so thin as being non-existent and therefore, there can be no electromigration damage in fact through the bottom, or interface 56.

The present invention novel structure 40 shown in FIG. 3 can be fabricated by a modified CVD technique which has been tailored to produce only a partially conformal film deposition. This is accomplished by selecting reaction conditions such that the deposition precursor molecules, i.e. typically the metal-containing species, are depleted as they attempt to move further or deeper into the via structure. The depletion is designed by controlling the reaction process or rate such that it is more likely that the deposition precursor molecules are used up in the upper, or higher features on the surface. In effect, the conformality process has been de-tuned such that perfect conformality cannot be achieved. It is hypothesized that the effective sticking or reaction coefficient for the precursor molecules has been increased. As a result, it is less likely that the precursor molecules will react down to the very bottom of a deep via without being incorporated into the sidewall deposits. The modified CVD process therefore is most exaggerated within the vias, since they have a much higher surface-to-volume ratio than the trenches or lines. In fact, since the trenches are generally shallow when compared to the vias, and are more open to the deposition precursor flux generally flown in from the top of the chamber, the deposition in the trenches should be completely conformal and a thick deposit can be formed on the trench bottom as well as on the sidewalls.

The present invention novel method provides a transport-limited deposition scheme to produce liner structures such as those shown in FIG. 3. The requisite transitions for transport-limited deposition can be obtained by performing the CVD reaction at very low partial pressure or by raising the sample temperature to make the reaction process occur more readily. For instance, an example of the transport-limited deposition process is a modified CVD deposition of W films by using $W(CO)_6$ (tungsten carbonyl) precursor. Tungsten is a desirable liner material for use in most advanced semiconductor devices. The modified CVD deposition technique can be carried out in a cold-wall low pressure stainless steel reactor with a base pressure between about $10^{-9}$ Torr and about $10^{-6}$ Torr, and preferably at the lower end. The precursor is delivered to the reaction chamber with or without a carrier gas. The deposition partial pressure is in the low range, i.e. typically 5 mTorr or less, with the semiconductor substrate held at a temperature of at least 350° C., and preferably 400° C. The semiconductor substrate is a silicon wafer that has a patterned dielectric upper layer such as silicon dioxide, polyimide, or silicon nitride for the via openings. A SEM technique is used to measure the deposited films.

As shown in FIG. 3, the W film of the liner layer is tapered down on the sidewalls of the high aspect ratio vias, as expected. In some cases, there appears to be a thin deposit on the via bottom, especially when films are grown thicker than the desired thickness for liner applications such that they can be more easily observed using the SEM. In most tests conducted, liner films of significantly less than 10 nm are obtained, which are difficult to observe under SEM.

The present invention novel method may be enhanced by two optional modifications. Both optional modifications utilize the effect of ion bombardment. The first enhancement is the use of ion bombardment to make deposition at the bottom of the via even thinner or to remove it altogether. The second enhancement utilizes a variation of ion bombardment to increase the adhesion of an additional seed layer to the deposited CVD liner film.

In the first modification, since the film thickness of the transport-limited CVD process is significantly greater on the bottom surface of a trench as opposed to the bottom surface of a deep via, small amounts of physical sputtering can remove any thin or residual deposits at the bottom of the via without completely eroding or removing the film from the bottom of the trench. Liner material sputter removed from the bottom surface can be redeposited on the sidewalls, and therefore increasing their effective thickness and diffusion-barrier property. The first optional process enhancement to the transport-limited CVD step is therefore to use physical sputtering of the as-deposited film to reduce even more or else completely eliminate the deposit at the bottom of a via without compromising the liner thickness at any other surfaces, such as at the bottom of a trench.

In the second optional modification to the present invention transport-limited CVD deposition process, an additional metal seed layer may be subsequently deposited on the surface of the liner film. In a typical example, a thin layer of copper is deposited on top of the liner surface which then functions as a seed layer for the subsequent electrodeposition or CVD of a thick Cu film. It is the unique discovery of the present invention that the adhesion of the seed layer film, when deposited by a conventional PVD or CVD technique, is poor. The poor adhesion is caused by the fact that copper bonds only weakly to W under typical deposition conditions. The present invention novel enhancement method to the depletion-limited CVD process is to use physical sputtering on the W liner with Cu ions leading to significantly greater adhesion of the subsequently-deposited Cu films. This is accomplished by using energetic ion bombardment of the as-deposited W liner with Cu ions, while unlike the conventional deposition process, the kinetic energy of the ions of Cu is increased to at least 50 eV. This results in low-level implantation of the Cu ions into the upper surfaces of the W liner layer. Thus, subsequent deposition of Cu films by any means, i.e. PVD, CVD, electroless, or electroplating results in much better bonding of the Cu film, since it is partially bonding to the surface-implanted Cu ions. The process can be implemented in a typical I-PVD tool by operating at high sample bias voltages and without any intentional sputtering of the magnetron cathode In fact, the magnetron cathode in the I-PVD system is not used, or else is used at a very low level. The operation of the RF coils at modest power, i.e. typically 1~3 KW, results in some level of sputtering from the RF coil.

It has been found that the adhesion of the subsequently-deposited Cu films to the W liner surface is increased significantly, i.e, from an adhesion strength of smaller than 0.19 to a value of greater than 0.6 $MPam^{1/2}$.

The present invention novel method for forming an open-bottom liner for a conductor in an electronic substrate and devices formed by the method have therefore been amply described in the above description and in the appended drawing of FIG. 3.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming an open-bottom liner for a conductor in an electronic structure comprising the steps of:

providing a pre-processed electronic substrate having a dielectric layer on top, forming via openings in said dielectric layer exposing an underlying conductive layer, positioning said electronic substrate in a chemical vapor deposition chamber, heating said electronic substrate to a temperature of at least 350° C., flowing a precursor gas into said CVD chamber to a partial pressure not higher than 10 mTorr, and depositing metal from said precursor gas onto sidewalls of said via openings while leaving bottoms of said via openings substantially uncovered.

2. A method for forming an open-bottom liner for a conductor in an electronic structure according to claim 1 further comprising the step of providing a pre-processed silicon wafer that has a silicon oxide, polyimide or silicon nitride layer on top.

3. A method for forming an open-bottom liner for a conductor in an electronic structure according to claim 1 further comprising the step of heating said electronic substrate to 400° C. prior to said deposition step.

4. A method for forming an open-bottom liner for a conductor in an electronic structure according to claim 1 further comprising the step of flowing $W(CO)_6$ into said CVD chamber for depositing W into said via openings and forming said liner on the sidewalls.

5. A method for forming an open-bottom liner for a conductor in an electronic structure according to claim 1 further comprising the step of removing residual W deposited at the bottom of the via openings by at least one of inert gas ions and Cu ions.

6. A method for forming an open-bottom liner for a conductor in an electronic structure according to claim 1 further comprising the step of depositing a Cu seed layer by PVD, CVD, electroless or electroplating on top of said W liner in said via openings.

7. A method for forming an open-bottom liner for a conductor in an electronic structure according to claim 1 further comprising the step of depositing a Cu seed layer on top of said W layer by an ionized physical vapor deposition (I-PVD) technique set at a kinetic energy of the Cu atoms of at least 50 ev.

8. A method for forming an open-bottom liner for a conductor in an electronic structure according to claim 1 further comprising the step of depositing a Cu seed layer on top of said W layer of a sufficient thickness such that a bond strength achieved between a subsequently deposited Cu film and a W liner is at least 0.4 $MPam^{1/2}$.

9. A method for forming via plugs in a semiconductor substrate comprising the steps of:

providing a semiconductor substrate that has a dielectric layer deposited on top, forming via openings in said dielectric layer exposing an underlying conductive layer, positioning said semiconductor substrate in a CVD chamber, heating said semiconductor substrate to a temperature of at least 350° C., flowing a precursor gas into said CVD chamber to a partial pressure not higher than 10 mtorr, depositing a metal liner layer from said precursor gas onto sidewalls in said via openings without depositing on bottoms of said via openings, depositing a metal seed layer into said via openings covering sidewalls and bottoms of said via openings, and depositing a metal film of the same material as the metal seed layer filling said via openings and establishing electrical contact with said underlying conductive layer.

10. A method for forming via plugs in a semiconductor substrate according to claim 9 further comprising the step of depositing a metal liner layer in W and depositing a metal seed layer in Cu.

* * * * *